(12) United States Patent
Kennedy et al.

(10) Patent No.: US 6,976,855 B2
(45) Date of Patent: Dec. 20, 2005

(54) SOLDER RESERVE TRANSFER DEVICE AND PROCESS

(75) Inventors: Craig M. Kennedy, San Marcos, CA (US); Donald S. Eisenberg, Carlsbad, CA (US)

(73) Assignee: Auto Splice Systems Inc., San Diego, CA (US)

( * ) Notice: Subject to any disclaimer, the term of this patent is extended or adjusted under 35 U.S.C. 154(b) by 0 days.

(21) Appl. No.: 10/843,972

(22) Filed: May 13, 2004

(65) Prior Publication Data
US 2004/0209495 A1     Oct. 21, 2004

Related U.S. Application Data

(63) Continuation-in-part of application No. 10/310,215, filed on Dec. 6, 2002, now Pat. No. 6,780,028.

(51) Int. Cl.⁷ .............................................. H01R 9/09
(52) U.S. Cl. ..................................... 439/83; 439/876
(58) Field of Search ................... 439/83, 84, 874–876; 174/263, 265, 94 R; 361/774, 773, 403

(56) References Cited

U.S. PATENT DOCUMENTS

| | | | | |
|---|---|---|---|---|
| 3,601,750 A | * | 8/1971 | Mancini | 439/84 |
| 4,500,149 A | * | 2/1985 | Mackay | 439/83 |
| 4,646,204 A | * | 2/1987 | Brauer | 361/767 |
| 4,655,517 A | * | 4/1987 | Bryce | 439/83 |
| 4,663,815 A | * | 5/1987 | Hartman et al. | 29/839 |
| 4,797,110 A | * | 1/1989 | Ponziani et al. | 439/83 |
| 4,854,472 A | * | 8/1989 | Semersky | 220/783 |
| 4,855,517 A | * | 8/1989 | Metz et al. | 570/206 |
| 4,877,176 A | * | 10/1989 | Kubis | 228/173.5 |
| 4,884,335 A | * | 12/1989 | McCoy et al. | 29/839 |
| 4,943,846 A | * | 7/1990 | Shirling | 257/697 |
| 5,033,675 A | * | 7/1991 | Shino | 439/66 |
| 5,035,656 A | * | 7/1991 | Patel | 439/733.1 |
| 5,169,347 A | * | 12/1992 | Sang | 439/885 |
| 5,641,291 A | * | 6/1997 | Sueki et al. | 439/83 |
| 5,656,798 A | * | 8/1997 | Kubo et al. | 174/265 |
| 5,816,868 A | * | 10/1998 | Legrady et al. | 439/876 |
| 6,011,222 A | * | 1/2000 | Sekiya et al. | 174/266 |
| 6,116,921 A | * | 9/2000 | Scholz et al. | 439/83 |
| 6,229,101 B1 | * | 5/2001 | Sekiya et al. | 174/266 |
| 6,259,039 B1 | * | 7/2001 | Chroneos et al. | 174/263 |
| 6,402,531 B1 | * | 6/2002 | Legrady | 439/83 |
| 6,402,574 B2 | * | 6/2002 | Cachina et al. | 439/876 |
| 6,623,283 B1 | * | 9/2003 | Torigian et al. | 439/83 |
| 6,644,983 B2 | * | 11/2003 | Recktenwald et al. | 439/75 |
| 6,773,269 B1 | * | 8/2004 | Downes | 439/75 |

* cited by examiner

Primary Examiner—Alexander Gilman

(57) ABSTRACT

A solder transfer method which uses an electrically-conductive, e.g., metal, surface, of a stamping or pin or pad as a vehicle to transfer molten solder from a remote solder reserve to a solder joint to be made. In one of the preferred embodiments, a solder deposit previously formed on a surface mount pad during a first reflow step will transfer up to the adjoining contact surfaces by a wicking process to provide the additional solder needed to fabricate a robust solder joint. The method and construction are useful for attaching a daughter board to motherboard, and for surface mounting a long header with multiple pins to the contact surfaces of a PCB without the need to separately add solder during a second reflow step to make a robust solder joint between the contact surfaces.

25 Claims, 11 Drawing Sheets

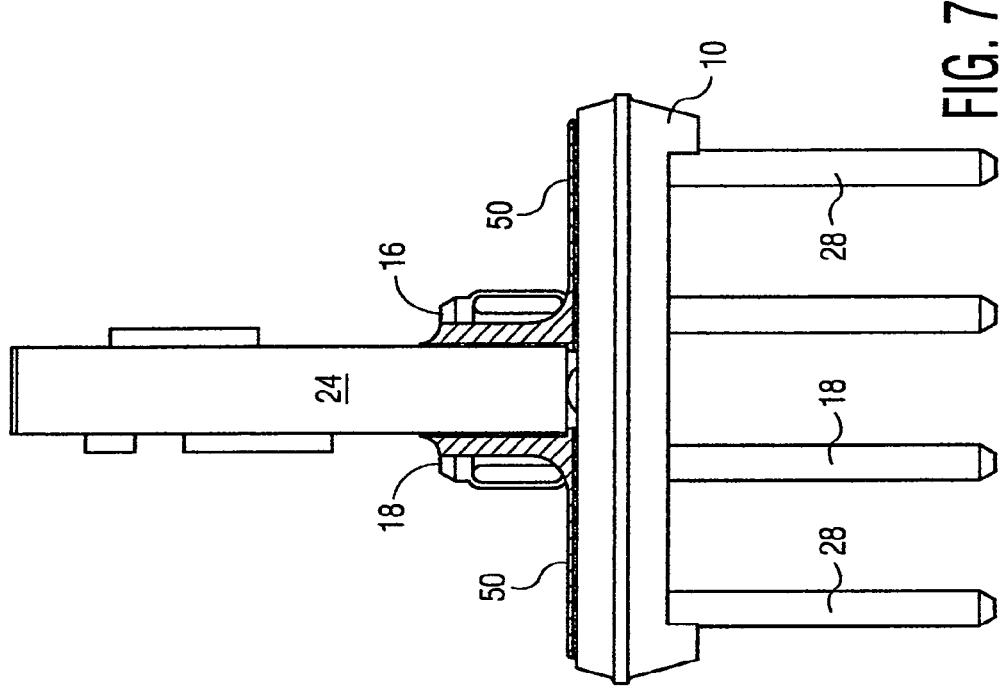
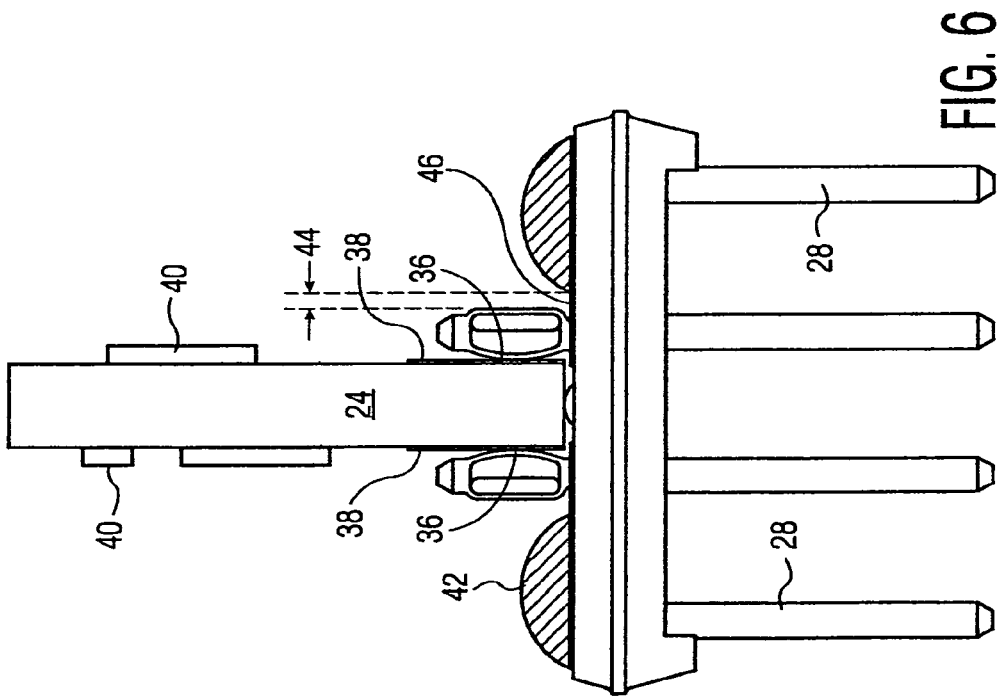

SOLDER RESERVE TRANSFER DEVICE AND PROCESS

RELATED APPLICATION

This application is a continuation-in-part of a commonly owned parent application, application Ser. No. 10/310,215, filed Dec. 6, 2002, now U.S. Pat. No. 6,780,028.

The invention is directed to printed circuit boards (PCB) or the like (sometimes referred to as printed wiring boards (PWB)), to electronic devices for interconnecting PCBs, to devices for mounting PCBs onto a substrate, and to processes for solder attaching electronic components to a substrate. The invention is also particularly concerned with attaching a daughter card to a motherboard, especially to permanently attaching a daughter card perpendicularly to a motherboard, and to surface mounting a header with multiple pins to pads on the PCB.

BACKGROUND OF INVENTION

Nowadays, there are several ways to attach a daughter card perpendicular to a motherboard. These include the following.

1. Removable Edge Card Connector—There are available several removable edge card connector designs where the daughter card such as a memory card, arranged perpendicular to the motherboard, is inserted into a group of pins or contacts that are pre-loaded with a determined amount of force. These contacts are held in place by a molded insulator and hard soldered to the motherboard. The result is a non-soldered, removable interconnect between the memory card or edge card connector and the PCB.

2. Submerged Soldering—Another method of lead attachment comprises inserting the memory card or other PCB with surface mount technology (SMT) pads between two rows of contacts that are held together in a carrier, which is sometimes also referred to as a header. This assembly is fluxed and then submerged into a solder bath up to the SMT pads on the memory card or PCB. This approach results in a permanent soldered interconnect, which, however, requires that the PCB's or memory cards be singulated and put through a secondary process, off-line, which is time-consuming and expensive.

3. Hand Soldering—This attachment method requires a single point solder reflow for each individual contact. An operator would touch a soldering iron and solder wire to make each solder joint. This method is slow and very labor intensive and also requires secondary processing off-line.

4. Screen Print/Solder Bump—In this scheme, during placement of other components on the PCB, solder paste is placed on the SMT pads on the "A" side of a printed circuit board (the terms "A" side and "B" side are meant to designate the two major surfaces of a PCB, with the A side representing the first surface processed and the B side the opposite surface). components are placed onto the paste and then the assembly is reflowed. "Reflowing" is a term of art typically meaning that an assembly is fluxed and then heated to a temperature above the melting point of any solder present causing the solder to penetrate adjacent crevices between solderable electrically-conductive surfaces, typically of copper or a copper alloy, such that upon cooling the solder freezes forming a permanent electrical connection between the electrically-conductive surfaces. The PCB board is then flipped, wet screen paste is applied on the B side, components are placed on the B side, and then a connector for the memory card is placed over the bumps on the A side SMT pads and their leads are placed into the "soft" paste on the SMT pads on the B side, followed by both sides being reflowed. This process does not produce a desirable solder attachment because the leads of the connector are spread when placed over the bumps to the memory card leaving a space or gap between the pin contact region and the SMT pad after reflow.

The problems associated with surface mount soldering a header, especially a long header, to a PCB will be discussed below.

SUMMARY OF INVENTION

A principal object of the invention is to solder-attach leads to the edge contacts of a PCB, such as a memory card, for attachment to another PCB, such as a motherboard.

Another object of the invention is to solder-attach leads to the edge contacts of a PCB, such as a memory card, for perpendicular attachment to a motherboard without the need to add solder during this last process.

A further object of the invention is an in-line process for permanently soldering the adjoining contact surfaces of electrical components by reflowing solder without separately adding directly to the joint additional solder during the reflow step to fabricate a robust solder joint between the components.

Still another object is to surface mount a header with multiple pins, especially a long header, to multiple pads on a PCB.

These and other objects are achieved in accordance with one feature of the invention by a solder transfer method which uses an electrically-conductive, e.g., metal, surface, stamping or pin or pad as a vehicle to transfer molten solder from a solder reserve to a solder joint to be made.

In a preferred embodiment of the invention, a solder deposit previously-formed on a surface mount pad during a first reflow will transfer up to the adjoining contact surfaces by a wicking process to provide the additional solder needed to fabricate a robust solder joint. When, for example, one of the contact surfaces is a contact or pin on a first PCB or carrier, and the other contact surface is a SMT pad on a second PCB serving, for example, as a memory card, the process of the invention makes for an easy SMT processed attachment of the memory card to the first PCB without the need to add solder during a second reflow step (only requiring fluxing before reflow) to make a robust solder joint between the contact surfaces.

In accordance with another preferred embodiment of the invention, a PCB, for example, with traces and plated through-holes, serving as a carrier or header, can be employed as the first PCB to provide a change-spacing method for the center to center and row to row spacing from the top to the bottom of the carrier. In other words, the top spacing can be chosen to match the contact spacing of the second PCB, and the bottom spacing can be chosen to match the (different) contact spacing of a third PCB on which the second PCB is to be mounted. Again, no additive solder processing is required. Alternatively, SMT interconnects rather than plated through-holes can be employed.

In accordance with another feature of the invention, a carrier with dual rows of pins forming contact surfaces for receiving the edge connector of a card provides the additional solder as a reflowed deposit on side surfaces of the pins.

In accordance with still another feature of the invention, a solder reserve is placed on one or both sides of the foot of each pin of a header, and during the second reflow, the solder reserve remelts and joins any other solder present at the joint to reinforce the joint and provide robust solder joints between each of the headers pins and the similarly arrayed pads on the PCB.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, like reference numerals or letters signifying the same or similar components.

SUMMARY OF THE DRAWINGS

In the drawings:

FIG. 6 is a partial end view of the upper part of the carrier of FIG. 3 after a PCB has been inserted between the facing contact pins of the carrier;

FIG. 7 is a view similar to that of FIG. 6 after the reflow step that permanently attaches the PCB to the carrier;

DETAILED DESCRIPTION OF PREFERRED EMBODIMENTS

While an embodiment of the invention will be described in a preferred embodiment of soldering an edge connector, such as a memory card, in a perpendicular orientation to a PCB, it will be understood that the invention has broad applications with respect to PCBs generally, carriers for components, headers, and in any application where it is necessary to make robust solder joints between the electrically-conductive surfaces of pins, pads and other shapes and configurations of electrical contacts. Also, when the term "PCB" is used herein, it means in general any electrically-insulating substrate or substrate portion that has or will be provided with an electrically conductive surface or surfaces. Well-known examples are substrates such as FR-4, ceramic, plastic, Teflon. Often, the electrically-conductive surface is a metal pin engaging a plated through-hole in the board enabling the projecting parts of the pin to be used for connection to other components or devices. Other times, the pin also contacts an electrically-conductive trace or contact pad on the PCB which can be used for connection to other components or devices. Other well-known possibilities are SMT pads on the substrate surface used for the external connection or connected to a pin or solder bump contact. An important application of the invention is where a PCB, such as a memory card, with edge contacts as a daughter board is to be permanently edge mounted onto a motherboard having traces to be connected to those on the memory card, but where the motherboard is provided with a female connector for receiving the male pins of a plug connector, lacking on the memory card, or the memory card lacks a contact array that matches the contact array on the motherboard. Preferably, the mounting of the daughter board to the motherboard is to be made in an in-line process which at the same time attaches further components to the motherboard. In a preferred embodiment of the invention, the daughter board is first mounted on a carrier as a connector which is chosen such that its contacts on a first surface match that of the daughter board, while the carrier's contacts on a second surface match that of the motherboard. By "in-line" process is meant that, during a single reflow step, a number of interconnected boards with temporarily-mounted components and connectors can all be reflowed and thus permanently solder-bonded in the same standard process.

Figure 1:
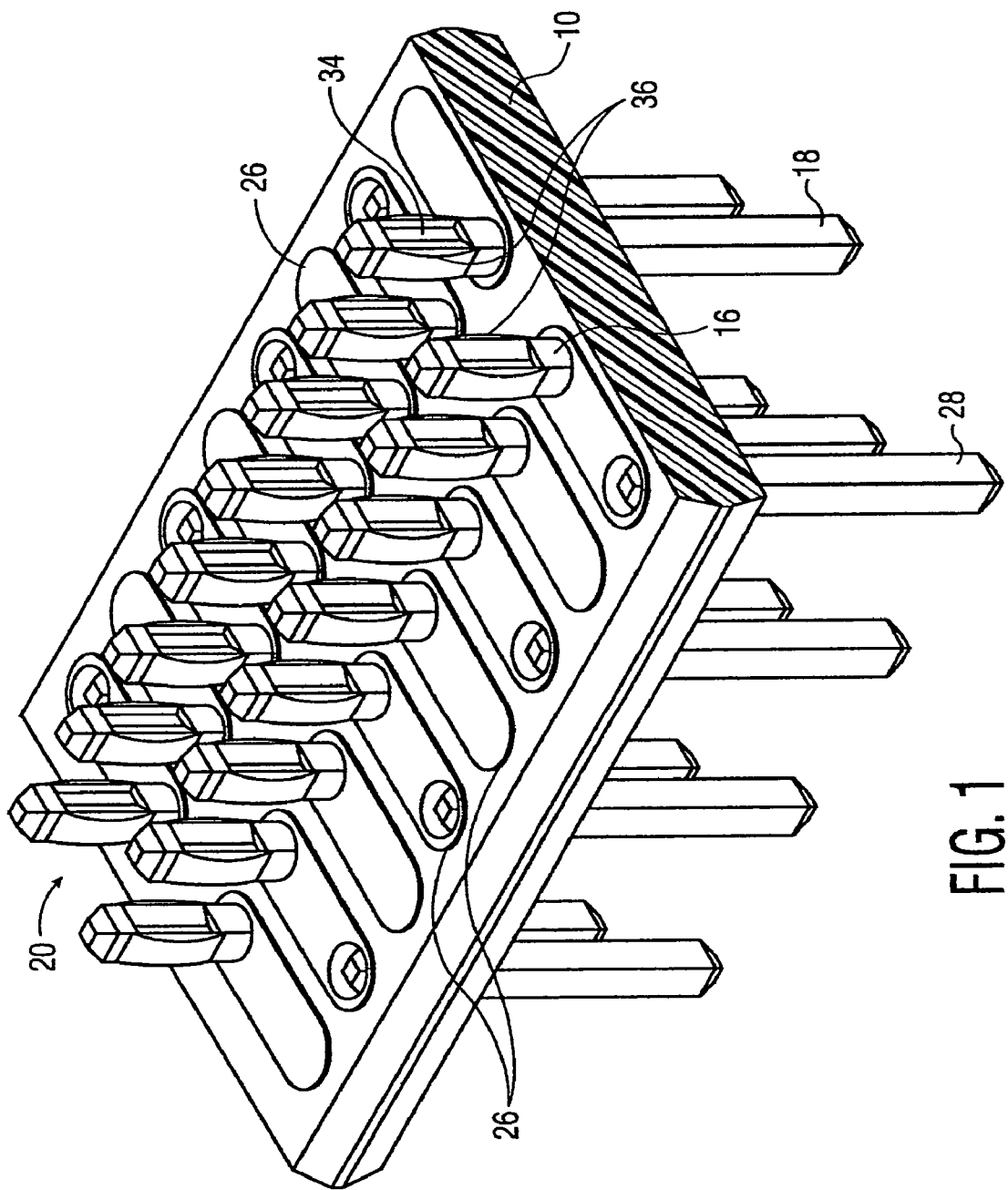
FIG. 1 is a partial perspective view of one form of pinned carrier or header in accordance with the invention prior to adding the solder reserve deposits.
Figure 2:
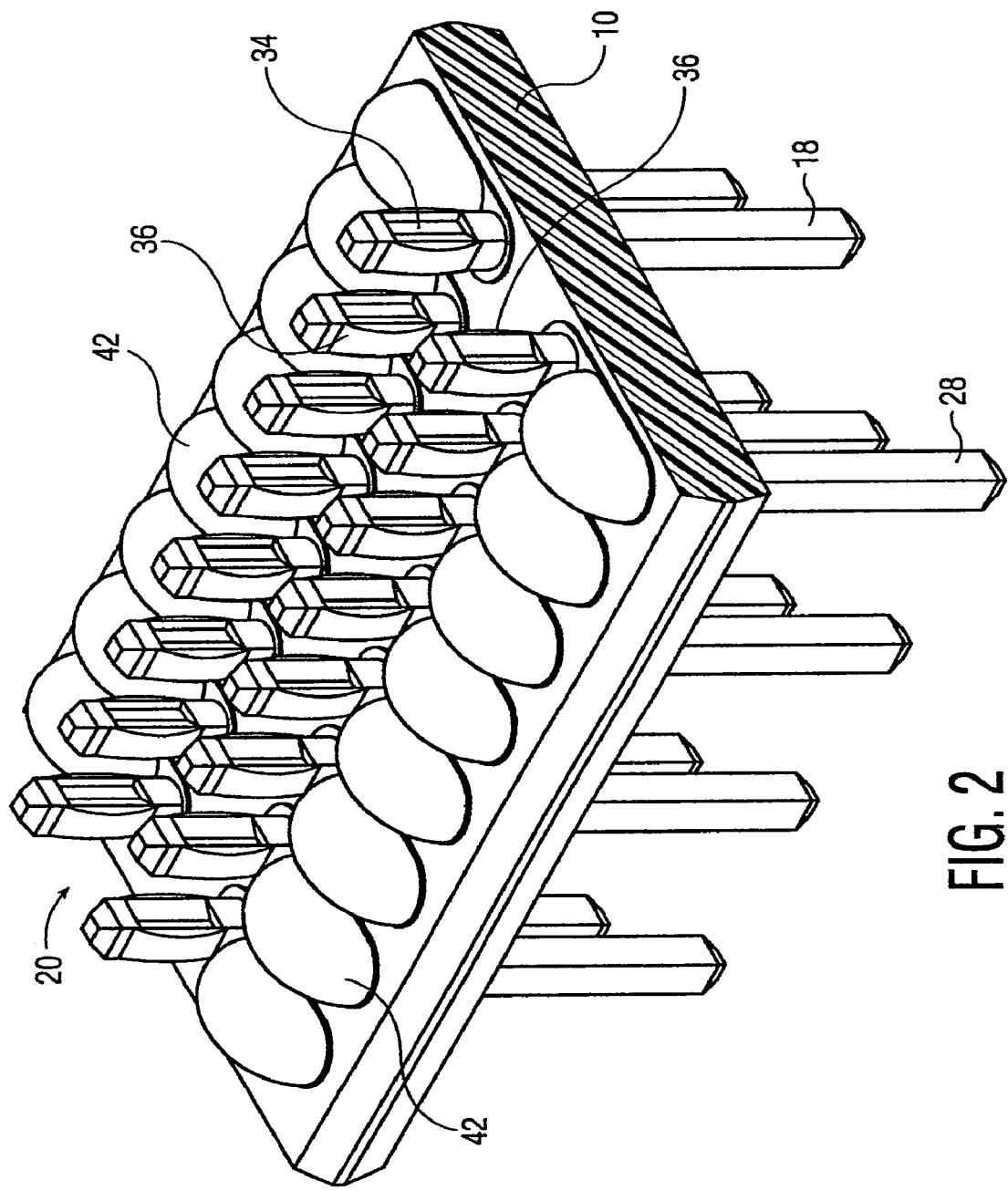
FIG. 2 is a perspective view similar to that of FIG. 1 showing the carrier after solder reserve deposits have been added.
Figure 3:
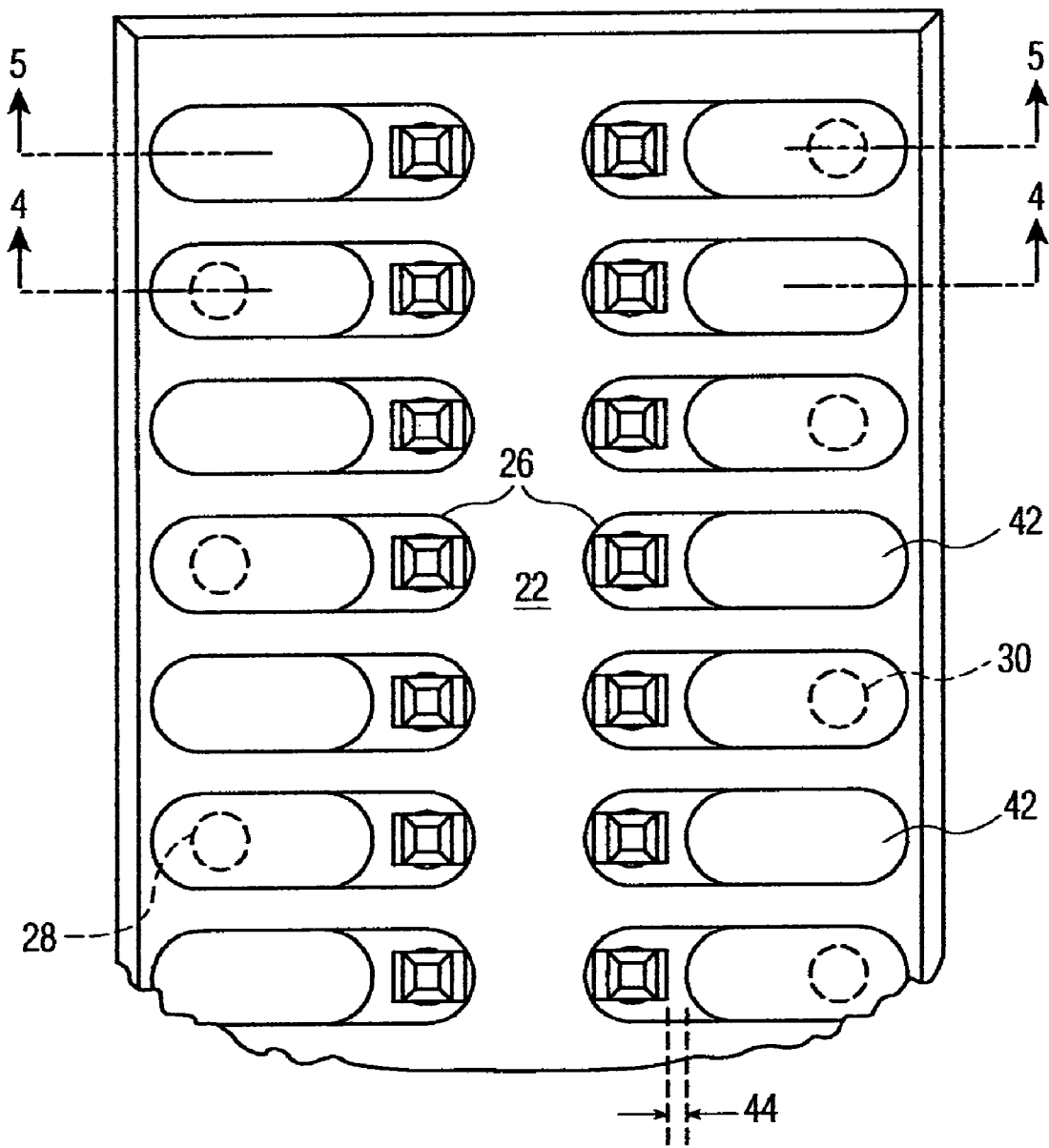
FIG. 3 is a plan view from the top of the carrier of FIG. 2.
Figure 4:
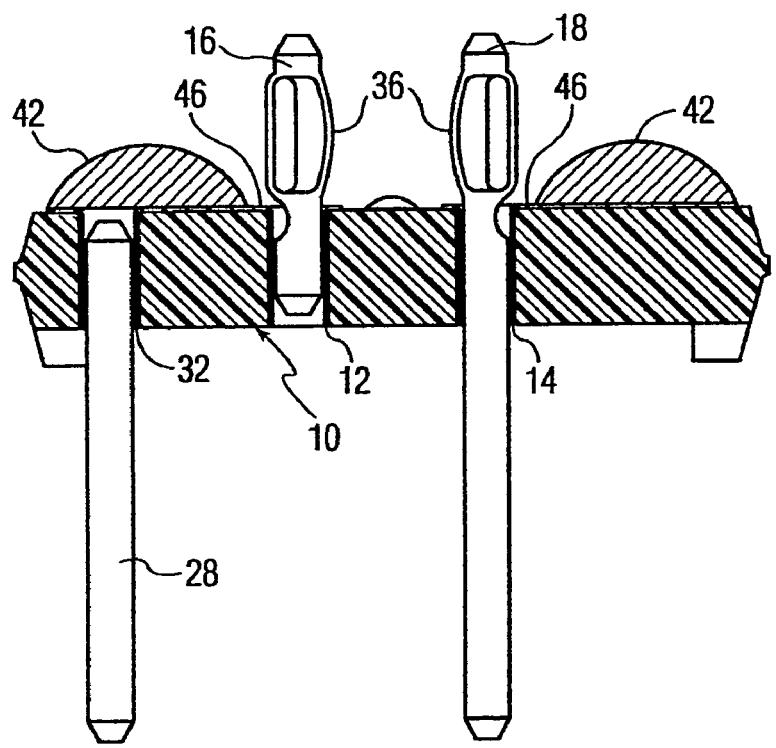
FIGS. 4 and 5 are cross-sectional views along the lines 4—4 and 5—5, respectively, of FIG. 3.
Figure 5:
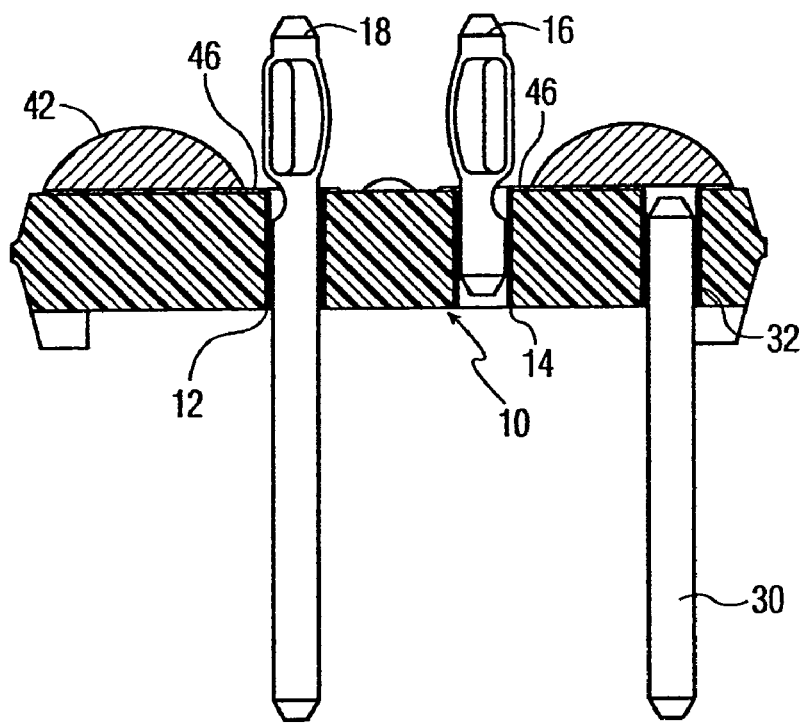

As an example to illustrate an important application of the invention, to which it is not to be limited, to address the in process requirements of the attachment of a connector to a memory card or other PCB, the unique method of the invention first inserts into a substrate or first PCB, to serve as an edge connector, dual contacts into plated through-holes of the first PCB. These plated through-holes are surrounded by or are in contact with surface mount pads. FIGS. 1–7 illustrate as the first PCB an electrically-insulating carrier 10 with dual rows of plated-through holes 12, 14 into which are inserted alternately arranged inner dual rows of short and long pins 16, 18. Both rows of inner pins form an upstanding array 20 defining a slot 22 for receiving the edge contacts of a second PCB 24. Each of the pins 16, 18 are connected to an SMT pad 26 that extends laterally on the top or first surface of the carrier 10 toward the outside edge. Third and fourth rows of pins 28, 30 are also inserted in their respective plated-through holes 32 along the outer edge of the carrier. These outer pins 28, 30 as shown extend only underneath the carrier's bottom or second surface. The upper parts of the pin rows 16, 18 are previously stamped or otherwise processed to form recesses 34 on opposite sides (the sides facing away from the opposite pin) causing contact bumps or bulges or protruding regions 36 to form at the pins sides facing the edge connector receiving slot 22 as well as on the their opposite backside (which does not play a role in this embodiment). The latter can be omitted by configuring the recesses 34 to bulge more on the slot side than on the backside. FIGS. 4 and 5 show this variation with the backsides more or less flat (again of no significance in this embodiment). The facing bumps 36 on the inner pin sides form contact surfaces for, for example, SMT pads 38 on the edge connector of the second PCB 24. Reference numerals 40 represent additional components that may be mounted on the second PCB 24.

On the bare surface of each of the SMT pads 26 on the carrier 10 is deposited a controlled predetermined amount of solder 42 to serve as a solder reserve. The deposits 42 are physically spaced from the adjacent upstanding pin by a distance (shown at 44 in FIG. 6), and that region 46 of the SMT pad is coated, as for example by screen printing, with a thin layer (not shown) of a flow-resist coating, such as an Entek coating, a well-known organic resin resist material. To attach each of the solder deposits to its underlying pad, the assembly is reflowed (first time) so the solder deposit melts. The flow-resist coating or surface is used on each surface mount pad 26 to limit the solder deposit from flowing down into the plated through-holes 12, 14 and be depleted. Typically, the flow-resist coating does not burn off during a first reflow step. The resist coating can also obviously be selectively applied where desired by any of well-known lithographic and masking techniques.

As will be appreciated by those skilled in the art, electrically-conductive surfaces intended for soldering are typically "tinned", i.e., provided with a very thin solder coat of tin or similar substance that promotes wetting by the molten solder, which typically also requires fluxing to remove any thin oxides that may have formed that inhibit wetting. This typical "tinned" contact cannot form a reliable solder joint with a contacted counterpart "tinned" contact unless additional solder is provided that fills in and solidifies around the contact region forming the typical fillet characteristic of well-made solder joints. During the first reflow step, the solder deposit 42 that will provide this additional solder reserve is attached by soldering to its underlying pad and prevented from flowing away by the intervening flow-resist coating. This first reflow step is carried out at a temperature below that at which the flow-resist coating is burned away—or a resist is chosen that for the most part will not burn away after just one reflow step—and is just sufficient to melt the solder deposits so they will temporarily attach to the pad. The resultant solder bumps after the first reflow step are illustrated in FIGS. 2–6 at reference numeral 42.

Next, the second PCB 24, such as the memory card, is inserted in the receiving slot 22 between the dual facing contacts 36 such that their pads 38 are in contact therewith. The dimensions are chosen such that the card 24 is held in place by a small interference fit in the slot 22, shown in FIG. 6. The dual contacts 36 are free of any additional solder that could obstruct insertion of the card edge. At least the second PCB 24 is then fluxed, or, preferably, the entire assembly is then fluxed and then run through a secondary reflow step at a higher temperature than that of the first reflow—the higher temperature may be unnecessary if a resist is chosen that will not burn away after just one reflow step but will after a second reflow step—, during which this time what remains of the flow-resist Entek coating is burned off and the molten solder from the solder deposits 42 by capillary action wicks over to the adjacent plated through-holes 12, 14, flows up the pins 16, 18, and collects on the contact junction between the pin contacts 36 and the contact surfaces of the SMT pads 38 on the memory card 24. The solder adheres and completely surrounds the contact sides of each of the pins and the contacted surfaces of the SMT pads on the memory card. Some solder may also go into the plated through-hole that the pin is inserted into and solders the pin into the hole, if not previously soldered.

When the second reflow step is complete and the solder hardens, as illustrated in FIG. 7, the solder under the influence of capillary action has formed a thicker layer 50 on the SMT pad, filled in any spaces at the plated-through-holes (not shown), and wicked up to fill any spaces at the edge contacts forming a good fillet around the joint and a robust reliable solder joint.

The spacing 44 between the solder deposits and the adjacent plated-through or contact which is to be occupied by the flow resist coat, depends on the size of the carrier or pins or pads, a larger spacing being allowed for larger carriers or pins or pads where the flow path is larger and a smaller spacing being allowed for smaller carriers or pins or pads where the flow path is smaller. The spacing 44 should be at a minimum about 0.001 inches, preferably about 0.003–0.06 inches. For the process where the pin is used as a transfer medium, the minimum spacing will typically be larger, about 0.02 inches. The size of the solder deposit similarly depends on the sizes of the carriers and pins and pads. It typically will occupy a volume of about 0.00001–0.00005 inches cubed. For an 8 position Dual Row FR-4 header using 0.025 inch pins, we have successfully used spacings 44 of about 0.03 inches and a solder deposit having a volume of about 0.000035 inches cubed. For a 100 position Dual Row FR-4 memory card adaptor/header using 0.018 inch pins, we have successfully used spacings 44 of about 0.01 inches and a solder deposit having a smaller volume. It will be appreciated that the invention is not limited to these examples, and those skilled in the art will have no difficulty in determining how large a solder deposit is required dependent upon the distance it must cover before reaching and filling the crevices at the solder joint to be made.

The contact region 36 on the pins is configured to have a smooth radius providing a good transitional contact point between the pin contact and the memory card edge pads and to ease insertion of the memory card between the rows of pins and before the solder is transferred and the solder joint is made. Had the added solder not been contained by the flow-resistant coating, but instead been allowed to transfer to the contact region before the insertion of the card edge, then the excess solder would likely form irregular non-smooth regions that would interfere with the inserted card and likely prevent even contact between each of the contact regions and the corresponding edge pad on the inserted card.

The quantity of additional solder provided is such as to also cover a plated through-hole where a pin has been inserted from the bottom side of the carrier. Alternatively, just a surface mount pad at the carrier top surface or its bottom surface can be used without a bottom inserted pin.

The contact array 20 is arranged in a specific pattern in the carrier such that a smaller PCB (daughter board or memory card) will be held perpendicular to the carrier 10.

This solder transfer process can be used to provide an excellent solder joint for any connection between two solderable conductive means. The solder can be of the conventional composition, such as 63-37 tin-lead or 90-10 tin-lead.

The carriers 10 serving as connectors can be attached to the edge of the memory card or PCB 24 while the board is still in panel form. After fluxing the connector 10 and the SMT pads of the boards the entire panel can be reflowed. This means that the components on both sides of the boards in the panel and the added solder deposits can be reflowed at the same time. This approach eliminates the need for secondary processing or off-line manufacturing as all the components and the connectors can be reflowed in the same standard process.

In the illustrated embodiment, there may or may not be present an annular ring or SMT pad on the bottom surface of the carrier for each pin.

In FIG. 7, the bottom inserted pins are also shown soldered into the plated through-holes.

Figure 8:
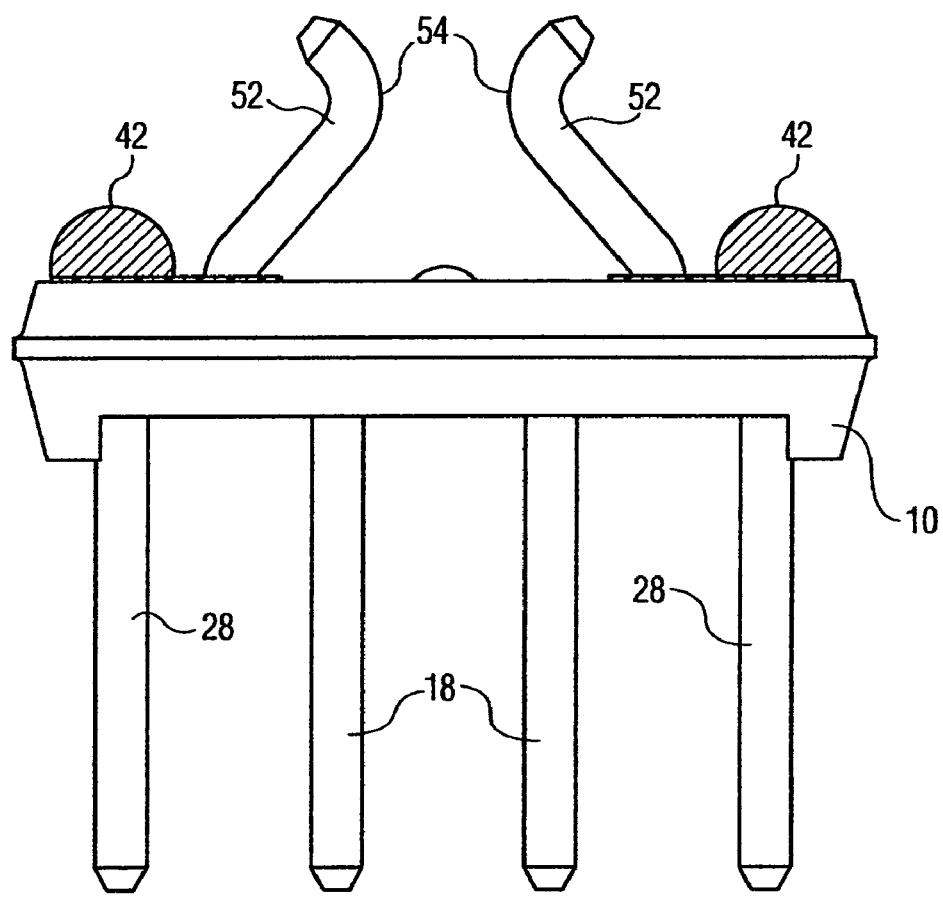
FIGS. 8 and 9 are views similar to that of FIG. 6 of two modified forms of pinned carrier according to the invention after provision of the solder deposits.
Figure 9:
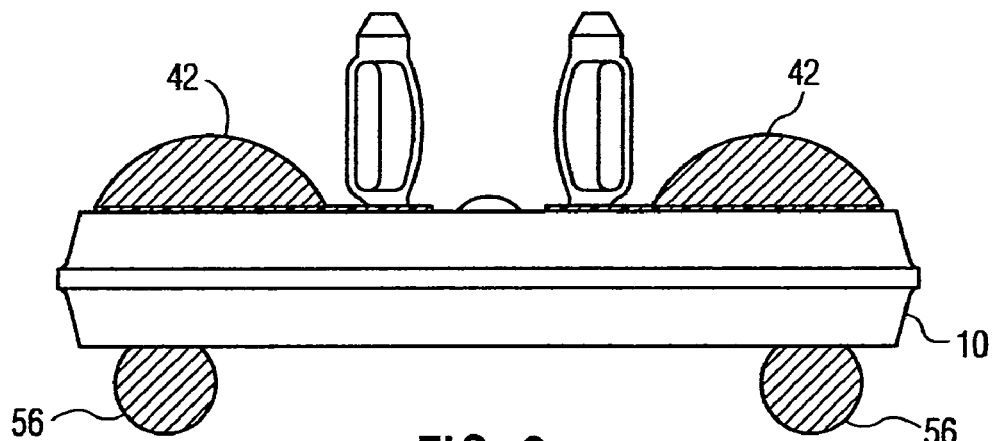

In the first embodiment illustrated in FIGS. 1–7, the pin configuration 16, 18 used to transfer the excess molten solder to the solder joint has straight sections, but it will be apparent that the transfer means can be of many different shapes as long as it touches the electrically-conductive surface 26 where the solder reserve 42 is deposited and also touches the electrically-conductive surface 38 of the memory card or conductive means that it is to be connected to. In other words, the transfer means, the pin 16, 18 of FIG. 1, must provide during the second reflow a continuous electrically-conductive wettable solder surface path between the solder reserve source and the joints to be soldered, after the flow resistant coating, which restricts the solder flow during the first reflow or deposit attachment step, has been removed, as for example by vaporization during the second reflow. In the variation shown in FIG. 8, the pins 52 that serve as the solder transfer conduits between the solder deposits 42 and the contact regions 54 where the solder joints will be made are curved to provided a beveled entrance for the card. In the FIG. 9 variant, the bottom surface of the carrier is provided with solder balls or bumps 56 connected by means of vias (not shown) to SMT pads on the top carrier surface. The solder balls allow for easy secondary attachment using SMT processing to the motherboard instead of through-hole attachment.

Figure 12:
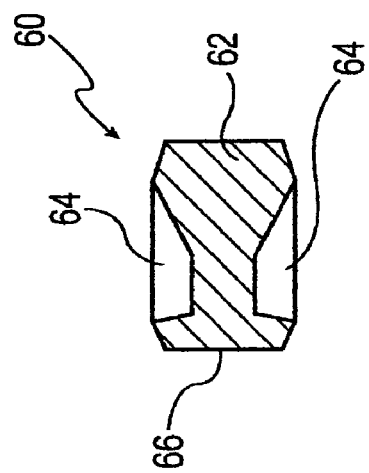
FIG. 12 is a cross-sectional view along the line 12—12 of FIG. 10.
Figure 11:
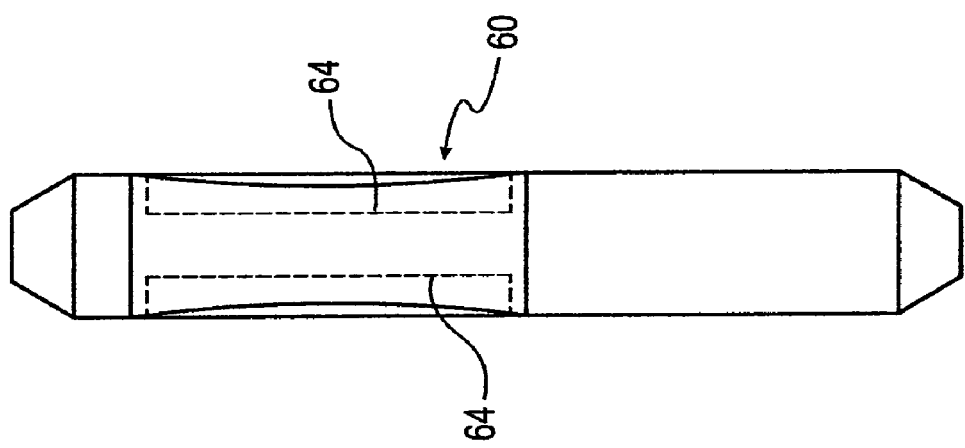
FIGS. 10 and 11 are front and side views, respectively, of one form of pin that can be employed in the invention.
Figure 10:
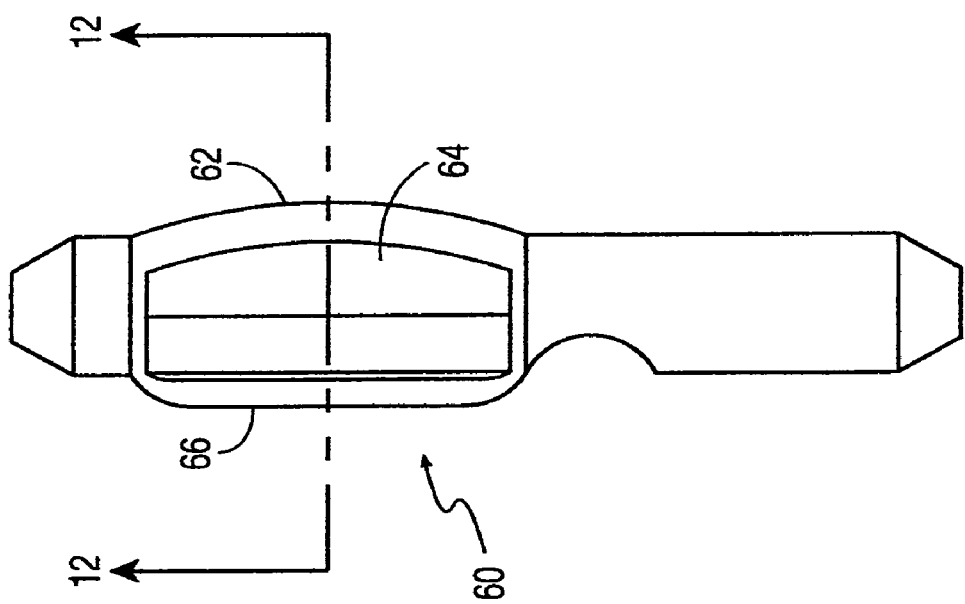
Figure 13:
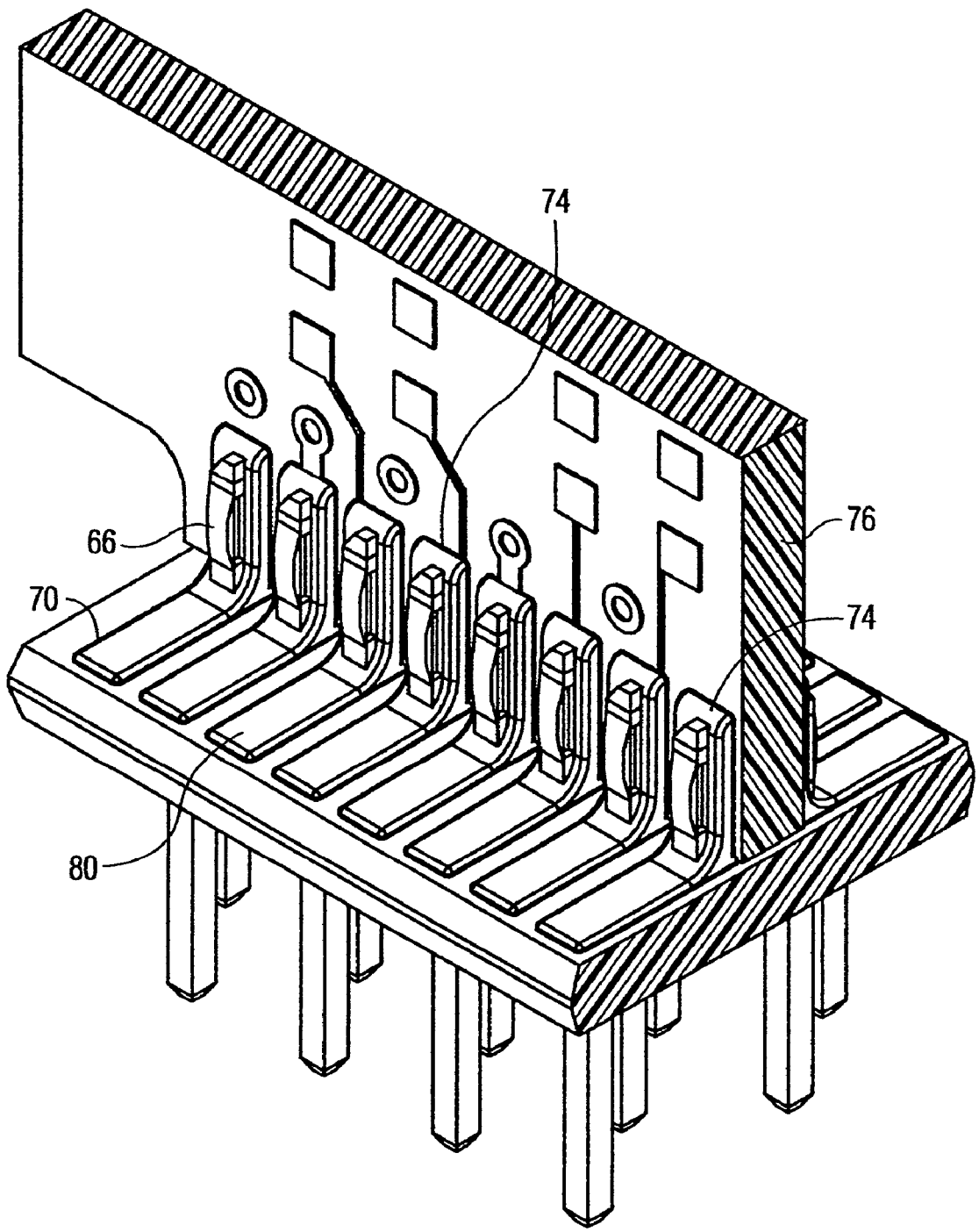
FIG. 13 is a partial perspective view of the carrier of FIG. 13 after reflow, and also illustrates a second embodiment of the invention.
Figure 14:
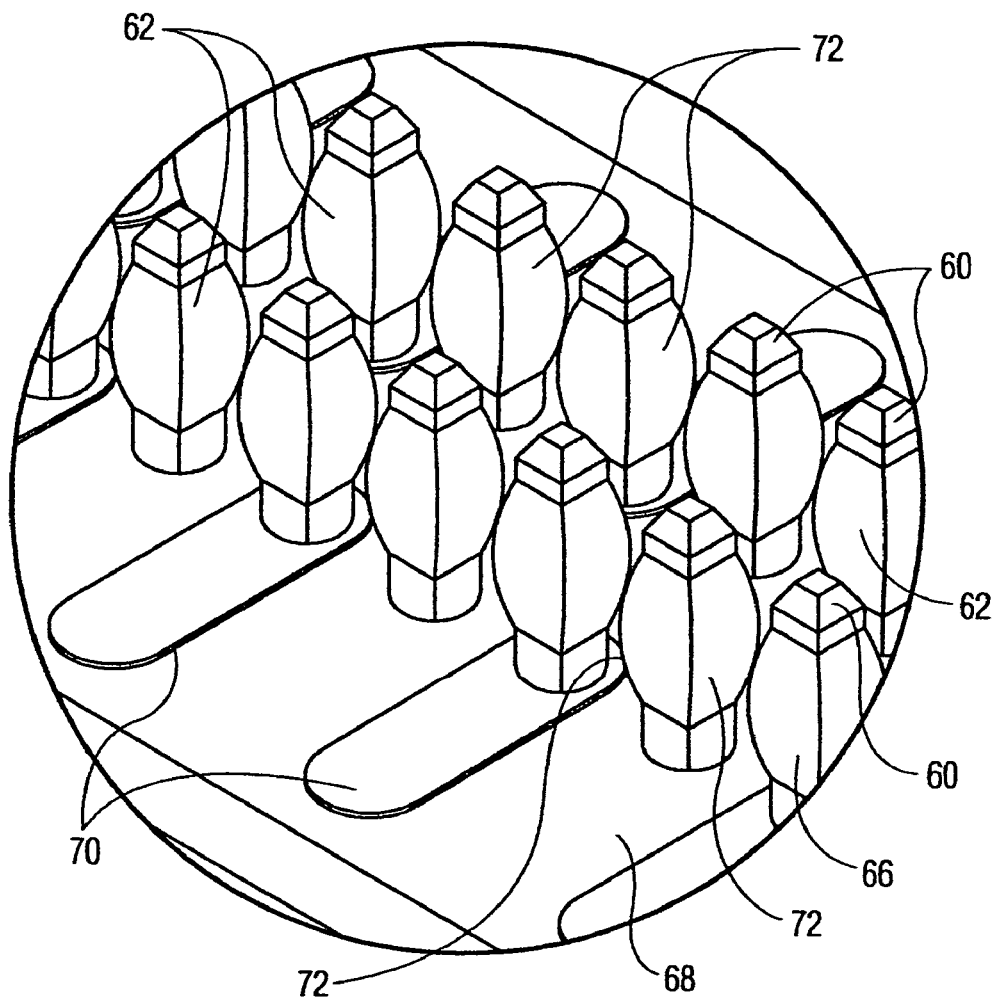
FIG. 14 is a partial perspective view of a carrier according to the invention for implementing the second embodiment of the invention.

In the embodiments so far described, the additional solder deposit is located on a solder pad away from the electrically-conductive member having the contact region that will form part of the solder joint. In the embodiments of FIGS. 10–14, the excess solder deposit is located on a surface region of the electrically-conductive member that is different from the surface region having the contact region that will form part of the solder joint. FIGS. 10–12 are examples of electrically-conductive members 60 that are punched or stamped to form a smooth preferably curved contact region 62 on a first surface and a recess or well 64 on one or more second side surfaces that are different and spaced from the contact region 62. As with the previous embodiment, the backside surfaces 66 that do not play a role in the soldering process can be flat or curved. Preferably, the electrically-conductive members 60, pins in this example, are inserted into a carrier 68 or other PCB before the wells 64 are filled with solder to serve as the additional solder reserve. A typical carrier 68 with its SMT pads 70 connected to the inserted pins is illustrated in FIG. 13. In a preferred way of accomplishing this, a solder mask is provided (not shown) everywhere except inside the well surfaces, and then the well side of the board is run through a wave solder process which causes molten solder to fill the wells 64 on the sides, and upon cooling solidifies to form the desired solid mass of excess solder, shown at 72 in FIG. 14, as well as to solder the pins into the plated through-holes. In this case, reserve solder 72 fills both wells 64 on the side surfaces of the pin. The additional solder 72, as before, is spaced from the contact surfaces 62 which remain free of any obstructions that may interfere with insertion of the second PCB or prevent proper contact between all of the contact regions 62 and the corresponding contact regions of the second PCB. The flow-resistant coating that prevented improper spread of the solder during the wave solder step is then removed by any convenient means, or as before the second reflow is used to burn off the flow-resistant coating. After the second PCB is inserted, only the second PCB needs to be fluxed and the assembly is subjected to a second reflow (counting the wave solder step as a first reflow) during which process the molten solder from the solder deposits 72 by capillary action wick around the pins and collect on the contact junction between the pin contacts regions 62 and the contact surfaces of the SMT pads 74 on the inserted card 76, and can flow as well into the plated through-holes. The solder adheres and completely surrounds the contact sides of each of the pins and the contacted surfaces of the SMT pads on the memory card. Some solder also goes into the plated through-hole that the pin is inserted into and solders the pin into the hole.

When the second reflow step is complete and the solder hardens, as illustrated in FIG. 13, the solder under the influence of capillary action has formed a thicker layer 80 on the SMT pad, filled in any spaces in the plated-through holes (not shown), and wicked around to fill any spaces at the edge contact array 74 forming a good fillet around the joint and a robust reliable solder joint.

The contact member used in the invention can be fabricated with different cross-sections, such as round, square, rectangular, and octagonal, etc. It can also have different shapes, and be fabricated by techniques in addition to stamping and punching, such as by using a screw machine approach or cold heading to make the pin rather than by stamping. The invention can be used with any kind of substrate that has openings into which a projecting member needs to be mounted by placement in the holes or can use solder bumps or other forms of interconnections. The invention can also be applied to projecting members from sockets or clips that will be soldered to an inserted component to be mounted onto a substrate.

Figure 15:
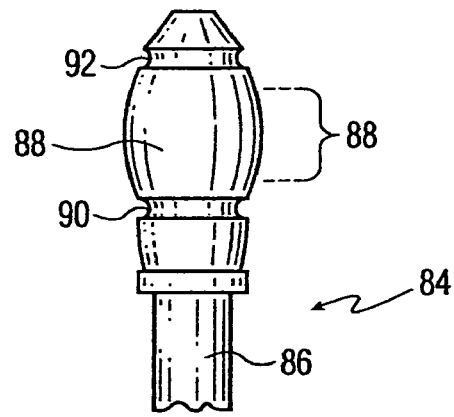
FIG. 15 is a partial plan view from the front showing a modified pin design according to the invention.

FIG. 15 illustrates a modified pin design of the screw machine type, comprising an electrically-conductive member 84 having a post 86 for mounting to a substrate, and a contact part 88. The latter has a curved top with a widened part designated 88 that forms the contact region that makes contact with the pads on the card when inserted between two lines of posts of the type illustrated. Spaced below and above, respectively, the contact region 88 are annular recesses 90, 92 which receive the solder deposits (not shown). The latter can be achieved by masking all but the recesses and wave soldering or other equivalent means that results in solidified melted solder filling the recesses 90, 92. The solidified solder (not shown in FIG. 15) remains spaced from the contact region 88. After the card has been mounted and the assembly reflowed, as before, the solder filling the recesses melts and wicks over to the contact region forming the desired robust solder joint at the contact region 88 with the mounted card (not shown).

Any solderable material, such as copper or copper alloy, brass or brass alloy, and phosphor bronze, can be used in this application. The overall pin lengths can cover a wide range, for example, from 0.25–2 inches.

It will be noted that the solder reserve, before transfer, preferably is a mass of solid material, which is preferably melted solder, preferably formed by a separate reflow step, and is not wet solder paste or any other kind of non-solid material.

FIGS. 16–23 illustrate another embodiment of the invention in a somewhat different context than the previous embodiments. In this embodiment, a problem arises when attempting to surface mount a relatively long header with multiple pins to solder pads on a PCB. By "header" is meant an insulating member, typically in the form of a small plate-like member, supporting a plurality of spaced pins. The pins are typically arrayed in one or more parallel rows. The pin arrangement can function to receive a female connector whose socket openings match the array of pins, or itself can be used as contacts to another PCB. An entire header is intended to be soldered to similarly arrayed solder pads on the PCB, meaning that each pin foot, which protrudes below the header, is surface mounted by solder to one of the pads. When the header length is longer than about one inch, especially with pins that have an extended mounting contact surface area, it is possible that the pin footprints are not exactly coplanar or not exactly parallel to the plane of the contact pads. As a result, gaps may arise between some of the solder footprints and their underlying pads, which could detrimentally affect the robustness of the solder bond of that or those pin(s) to the underlying pad. An attempt to resolve this problem has been made by adding a layer of solder paste to each of the pads before placing the header pins in contact with the pads. But this has not completely solved the problem, in that the solder paste does not provide enough additional solder during the remelt process to ensure robust connections between each of the pins and their contacted pads.

In this embodiment which addresses that problem, a solder reserve of hardened preflowed solder is provided in a well on the foot of each pin on at least one of the pin sides, preferably both pin sides. The reserve is not on the footprint of the pin, as this could aggravate the problem of uniform robust solder joints. During the second reflow, which is intended to surface mount the header or headers to the PCB pads, solder from the reserve remelts and flows down the pin sides to the contact region of the pin footprint and pad. This reserve provides enough additional solder at the joint to ensure that all the pins of the header are robustly solder connected to their respective pad even if not fully contacted to the pad or being slightly awry.

By "pin foot" is meant the portion of the pin below the header, and by "pin or contact portion" is meant the portion of the pin extending above the header. It is understood that the terms "above" and "below" are used for illustrative purposes and explanatory purposes, as such objects are frequently illustrated with the foot below the header, but it is not meant to be restricting since, obviously, after the solder operation, the PCB may be positioned sideways or upside down in which case the header foot could be positioned laterally or above the header, and such orientations are to be deemed also within the scope of the invention. By "footprint" is meant the surface area of the bottom surface of the foot intended to be placed in contact with the PCB pad, and by "extended surface mounting area" is meant a pin footprint whose contact surface area is at least about twice the cross-sectional area of just the pin portion itself. A good example of such a pin, which is not meant to be limiting, is the so-called SPACESAVER surface mount pin headers sold by Autosplice Inc., of San Diego, Calif. A typical header has a typically square pin of 0.025 inches per side (surface area of 0.000625 square inches), with a footprint contact area at the pin foot bottom of 0.025 by 0.060 inches (surface area of 0.0015 square inches), or about 2.4 times larger than the pin cross-section. This configuration produces what can be called a flattened foot with two opposed broad sides and two opposed narrow sides. The lack of pin footprint coplanarity is worse for the long header situation, which ideally requires, say, 12 or more pins arrayed in two rows to be in full surface contact with 12 pads. The problem becomes much worse for a so-called PR-4 header containing on one side 40 pins arrayed in two parallel rows, and on the other side 32 pins arrayed in two additional parallel rows, designed for receiving a 40 pin and/or a 32 pin female connector. In the invention, a well is provided at a side surface of the pin foot but spaced just above the pin footprint. Preferably the well is at the broad surface of the pin foot, and preferably a well is provided at opposite broad surfaces. By "well" is meant an open blind recess which is thus exposed at its opening and thus any material stored in the well is also exposed at the side of the foot and thus can readily flow out when remelted. In accordance with the invention, reflowed solidified solder is melted into the well or wells and thus acts as a solder reserve when the pin is surface mounted to its pad on the PCB.

Figure 16:
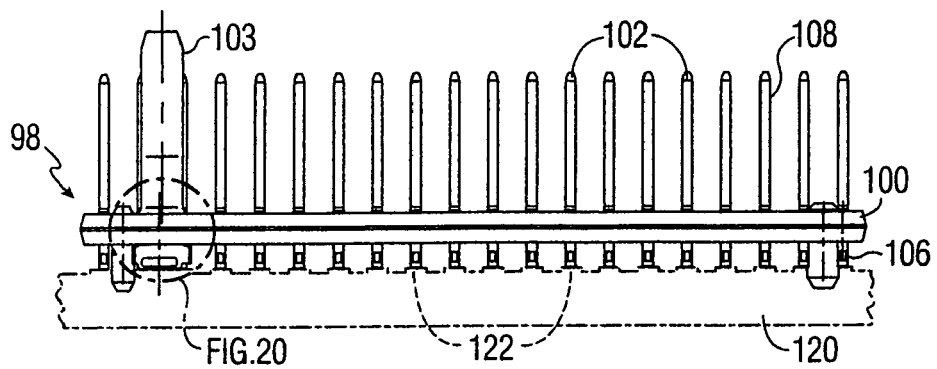
FIG. 16 is a side view of a long header.
Figure 17:
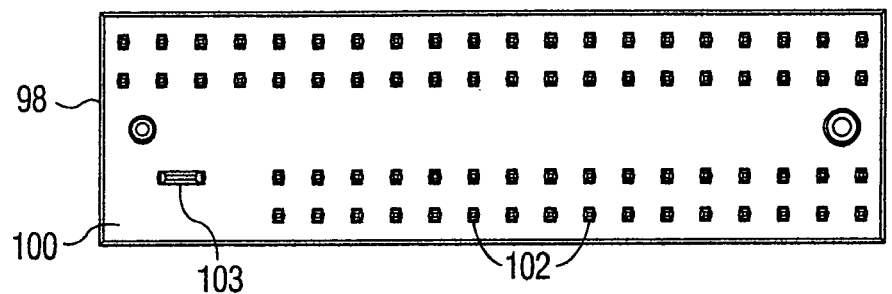
FIG. 17 is a top view of the header of FIG. 16.
Figure 18:
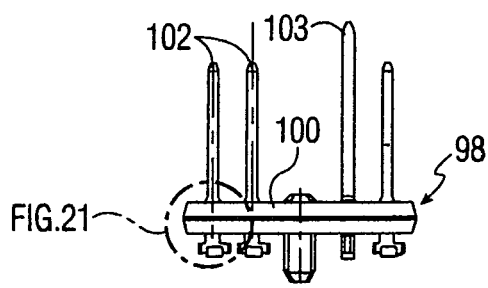
FIG. 18 is an end view of the header of FIG. 16.
Figure 19:
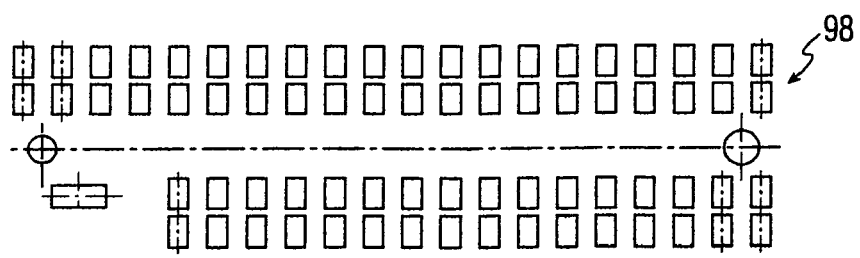
FIG. 19 is a bottom view of the header of FIG. 16.
Figure 20:
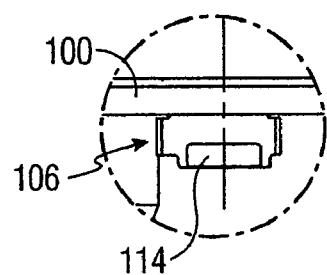
FIG. 20 is an enlarged detail view of the circled area labeled A of the header of FIG. 16.
Figure 21:
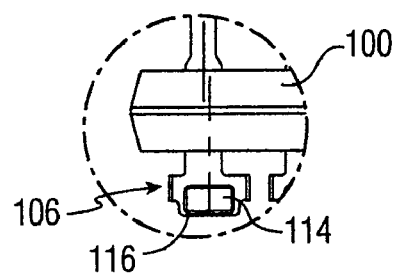
FIG. 21 is an enlarged detail view of the circled area labeled B of the header of FIG. 18.
Figure 22:
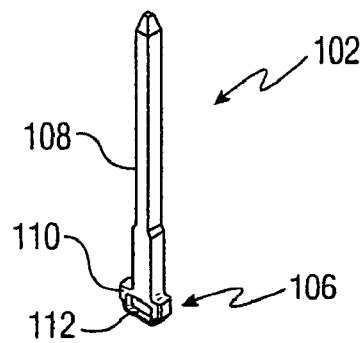
FIG. 22 illustrates one form of pin for use in the header of FIG. 16.
Figure 23:
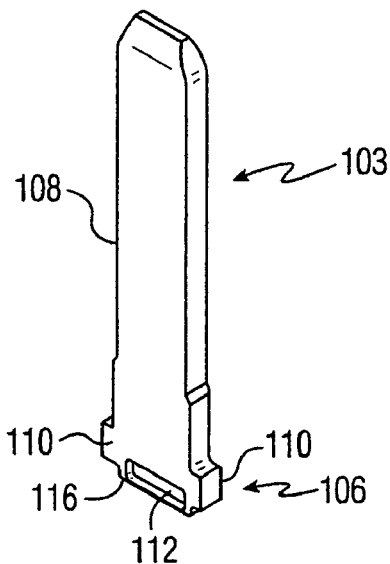
FIG. 23 illustrates another form of pin for use in the header of FIG. 16.

FIGS. 16–19 illustrates a typical SPACESAVER header 98 whose electrically-insulating pin support is referenced 100, and the pins 102, 103. The PCB can be similar to that illustrated in FIG. 14 with its solder pads on the board designated 70, except that the upstanding posts typically are not present In FIG. 16, a PCB 120 is shown in dashed lines. Its pads are shown at 122, each underlying one pin foot What is not shown is a layer of solder paste that is typically provided on the pads before the header is amounted. The paste layer thickness is not critical and can be about 0.003–0.006 inches thick. The two pins 102, 103 are shown in enlarged view in perspective in FIGS. 22 and 23. Each of the pins comprises a foot 106, and a pin portion 108, with the former below the header support 100 and the latter above as shown in FIG. 16. Each of the broad sides 110 of the pin foot is provided with a small cavity or well designated 112, each of which wells on each of the pins is filled with solid preflowed solder 114 before the header 98 is placed on the board. FIGS. 22 and 23 for simplicity show the wells empty, but the solder reserve deposit 114 is shown in FIGS. 20 and 21. The solder reserve deposit 114 typically fills most or all of the well 112.

The wells, as described above, are pre-filled with solder by selectively applying a solder wettable material in each well, or a solder non-wettable material everywhere but in the wells (e.g., by selectively plating in the appropriate way), and then passing the header through a wave solder process where the molten solder selectively sticks to the well interior and hardens during cooling Preferably the entire foot 106, from the well top downward, then, is tin-plated that is, coated with a high-solder flow promoting surface, whereas the pin portion 108 above is coated with a low-solder-flow material such as nickel. This insures that, during the second reflow, the melted-solder from the reserve tends to flow or wick along the high-flow surface toward the pin footprints, which is the bottom contact surface designated 116. The low-solder-flow material coating can terminate about halfway up the pin portion 108, and the remainder gold coated to ensure a good connection with the connector sockets. As will be observed in FIGS. 22 and 23, the well bottom terminates just above the pin footprint 116. Preferably, the spacing of the well bottom and thus of the lowest point of the reserve deposit from the footprint is at least about 0.002 inches, preferably at least about 0.004 inches. The spacing should slightly less than the solder paste thickness to ensure that the solder paste slightly overlaps and contacts the well solder deposit, which promotes solder flow to the footprint. For the example illustrated, the well 112 in the smaller pin was about 0.028×0.050×0.009 inches deep. Preferably the well depth exceeds about 0.005 inches. The pin portion was 0.025 inches square and the footprint was about 0.025×0.060 inches. These drawings are approximately to scale. The pin header illustrated was of the PR-4 type previously mentioned. The well volume and the reserve volume should be sufficient such that adequate additional solder from the reserve is provided at the joint during the second reflow. From the examples given, it was found that adequate additional solder can be made available from the reserve to ensure robust solder joints even when there was as much as a 0.005–0.010 inches gap between, a pin footprint and a pad surface.

To further deter solder flow upward along the pin, the pins 102, 103 are preferably pre-soldered into their respective holes in the header 100 by means of a higher-temperate solder than that used for the reserve deposit. The higher-temperature solder acts as a plug or barrier in the header through-holes to upward solder flow during the second reflow, which is carried out at a lower-temperature sufficient to melt the reserve deposit but not the high-temperature plug.

During the second reflow, when the assembly is reflowed, the solder in each of the reserves wicks down the pin sides and will supply the additional solder needed to fill any possible contact gaps between the pin bottoms and the pads.

The pins are conventionally tinned, but this tinning does not provide sufficient additional solder to solve the problems described above.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A solder reserve electrical connector having a first location comprising a first electrical contact surface region to be soldered to an electrical contact of an electrical component, said first location lacking sufficient solder for effecting a robust solder joint between the first surface region and the component's electrical contact when the component and connector are reflowed in a subsequent step, the connector comprising:
   a) a second location on the connector and spaced from the first location and comprising an attached reserve amount of solidifed, reflowed solder, created during a previous step, sufficient for effecting a robust solder joint between the first surface region and the component's electrical contact when remelted during a subsequent step and transferred to the first location,
   b) the amount of the solidifed, reflowed solder reserve and its spacing from the first contact surface region being such that, upon heating the component and connector to the solder reflow temperature during the subsequent step, the solidifed, reflowed solder reserve will remelt and wick from its position at the second location to the first location such that upon cooling a robust solder joint between the first contact surface region and the component's electrical contact can be effected,
   c) the connector comprising an electrically-conductive pin and the first location on the pin comprising the first contact surface region, said pin first contact surface region being free of excess solder to prevent obstruction to the component's electrical contact when it engages the first contact surface region,
   d) the second location being an exposed recessed surface on an outer surface of the pin that is spaced from the first location but is connected to the first location by a continuous exposed conductive solder-wettable path on the outer surface of the electrically-conductive pin.

2. A daughter card adapter for receiving and supporting a daughter card for connection to a motherboard, the daughter card comprising contact areas along both sides of an edge of the card, the daughter card adapter comprising:
   a) a substrate having at least two parallel rows of laterally spaced, upstanding pin connectors having facing contact regions, the contact regions forming a first pattern matching that of the card's contact areas,
   b) a plurality of contact pads on a first surface of the substrate each adjacent and in contact with one of the upstanding pin connectors,
   c) a discrete solder deposit of solidified solder on each of the pin connectors at an exposed recessed surface region at a first location spaced from their respective contact regions, the closest part of the solder deposit being spaced by a continuous exposed conductive solder-wettable external path from the contact region of the respective upstanding pin connector by a predetermined distance,
   d) the upstanding pin connectors having at the contact regions insufficient solder for effecting a robust solder joint to contact areas on the daughter card when the adaptor and the supported daughter card are engaged and reflowed,
   e) each of the solidified solder deposits containing sufficient solder for effecting a robust solder joint between the upstanding pin connectors' contact regions and the contact areas on the daughter card when the adaptor and the engaged daughter card are heated to reflow temperature causing the solder deposits to melt and wick along the conductive exposed solder-wettable external path on its upstanding pin connector to its contact region.

3. The combination of:
   (I) a substrate having first and second surface portions,
   (II) a plurality of aligned plated through-holes in the substrate arranged in at least two spaced rows,
   (III) a plurality of upstanding aligned male contact members mounted on the first substrate surface portion and also arranged in at least two spaced adjacent rows, each of the male contact members having a contact region, each male contact member in a row being laterally spaced from an adjacent male contact member, the spaced rows of male contact members being laterally spaced and with each male contact member in a row positioned to face with its contact region the contact region of an opposite male contact member in the adjacent row such as to form between the facing contact regions a slotted receiving region for card contact pads of an inserted edge contact card,
   (IV) a plurality of substrate solder pads on the first substrate surface portion, each of the substrate solder pads extending continuously between and in contact with one of the male contact members and the adjacent plated through-hole,
   (V) a series of external contacts on the second substrate surface portion each in contact with an adjacent plated through-hole,
   (VI) a discrete solder deposit on each of the male contact members at a first location adjacent to but spaced by a minimum distance measured along surface regions of the male contact member from the contact region of the male contact member, the closest part of the solder deposit being spaced from the adjacent contact region of the male contact member such that, when the substrate and an inserted edge contact card are heated to reflow temperature, the solder deposits are melted and wick along the surface regions of the male contact member to its contact region, such that upon cooling, a robust solder joint is formed between the male contact members and the pads of the inserted edge contact card.

4. A pin header comprising an insulating support and a plurality of spaced pins mounted to the header each having a foot portion and pin portion extending, respectively, from opposite sides of the header, the foot portions on one side forming an array of footprint contact areas arranged substantially coplanar for surface mounting to contact pads of a substrate, the foot portions of each of the pins at at least one pin side adjacent to but spaced from its footprint contact area comprising a well, a discrete solidified solder deposit of preflowed solder in each of the wells of the pins, each of the solidified solder deposits containing sufficient additional solder for effecting a robust solder joint between the footprint contact area of each of the pins and contact pads of the substrate when the header and substrate are heated to reflow temperature causing the solder deposits to remelt and wick along the pin to its footprint contact area.

5. A pin header as claimed in claim 4, wherein each of the pins is mounted to the insulating support by means of a relatively high-temperature solder, and the solder deposit in each of the wells comprises a relatively low-temperature solder.

6. A pin header as claimed in claim 4, wherein the header has a length of at least 1.5 inches and pins arrayed in at least two parallel rows.

7. A pin header as claimed in claim 4, wherein the surface of the foot portion of each of the pins comprises a high-flow-promoting material.

8. A pin header as claimed in claim 7, wherein the surface of the pin portion adjacent the insulating support of each of the pins comprises a low-flow-promoting material.

9. A pin header as claimed in claim 4, wherein the footprint contact area of each pin exceeds by at least a factor of two the pin cross-section of the pin portion.

10. A pin header as claimed in claim 9, wherein the well depth is about 0.005–0.010 inches.

11. A pin header as claimed in claim 10, wherein the volume of additional solder in each well is about 0.00001–0.00005 cubic inches.

12. A pin header as claimed in claim 4, wherein the foot portions of each of the pins at opposite pin sides adjacent to but spaced from its footprint contact area comprises a well, a discrete solidified solder deposit of preflowed solder in each of the wells of the pins, each of the solidified solder deposits containing sufficient additional solder for effecting a robust solder joint between the footprint contact area of each of the pins and contact pads of the substrate when the header and substrate are heated to reflow temperature causing the solder deposits to remelt and wick along the pin to its footprint contact area.

13. A pin header as claimed in claim 12, wherein opposite sides of the foot portion of each of the pins is flattened and wider relative to its pin portion and the wells are provided in the flattened sides.

14. A pin header as claimed in claim 13, wherein the wells in each foot portion of each of the pins are spaced from its footprint contact area by an amount at least equal to about 0.002 inches.

15. The combination of:
A) a printed wiring board having on one surface an array of solder pads;
B) a long pin header comprising an insulating support and a plurality of spaced pins arrayed in rows mounted to the header and each having a foot portion and pin portion extending, respectively, from opposite sides of the header, the foot portions on one side forming an array of footprint contact areas arranged substantially coplanar for surface mounting to the solder pads of the printed wiring board, the foot portions of each of the pins on opposite pin sides adjacent to but spaced from its footprint contact area comprising a well, a discrete solidified solder deposit of preflowed solder having been provided in each of the wells of the pins, each of the solidified solder deposits having contained sufficient additional solder and effecting a robust solder joint between the footprint contact area of each of the pins and the solder pads of the printed wiring board when the header and printed wiring board were heated to reflow temperature causing the solder deposits to remelt and wick along the pin to its footprint contact area.

16. The combination as claimed in claim 15, wherein the footprint contact area of each pin exceeds by at least a factor of two the pin cross-section of the pin portion.

17. The combination as claimed in claim 15, wherein the header has a length of at least 1.5 inches and pins arrayed in at least two parallel rows.

18. The combination as claimed in claim 15, wherein the well depth is about 0.005–0.010 inches, and the volume of additional solder in each well is about 0.00001–0.00005 cubic inches.

19. The combination as claimed in claim 15, wherein the surface of the foot portion of each of the pins comprises a high-flow-promoting material, and the surface of the pin portion adjacent the insulating support of each of the pins comprises a low-flow-promoting material.

20. The combination as claimed in claim 15, wherein each of the pins is mounted to the insulating support by means of a relatively high-temperature solder, and the solder deposit in each of the wells comprised a relatively low-temperature solder.

21. A process for surface mounting by soldering a long pin header to pads of a printed wiring board, comprising the steps:
(I) providing an electrically-insulating substrate having mounted by means of a relatively high-temperature solder a plurality of spaced pins arrayed in parallel rows, each of the pins having a foot portion and pin portion extending, respectively, from opposite sides of the substrate, the foot portions on one side forming an array of footprint contact areas arranged substantially coplanar for surface mounting to the pads of the printed wiring board, the foot portions of each of the pins on opposite pin sides adjacent to but spaced from its footprint contact area comprising a well,
(II) depositing in each of the wells a predetermined amount of solder,
(III) reflowing a first time the substrate to attach the solder deposit to each of the wells, the reflowing step being such that the reflowed solidified solder deposit remains substantially intact in the well during the first reflowing step,
(IV) coating the pads on the printed wiring board with a layer of solder paste,
(V) placing the header on the printed wiring board such that the pin footprint contact areas are as close as possible to a respective pad on the printed wiring board, the solder paste on the pads by itself lacking sufficient solder for effecting robust solder joints between pin footprint contact areas and the underlying pads when the header and printed wiring board are again reflowed, (VI) reflowing a second time the printed wiring board with the header in place, to cause the solder paste and the solder deposits in the wells to melt and the molten solder from the latter to wick down the pin's foot to the joint between the printed wiring board's contact pads and the footprint contact areas, each solder deposit containing sufficient solder for effecting a robust solder joint between the printed wiring board's contact pads and the footprint contact areas of the pins when the header and printed wiring board are cooled.

22. The process as claimed in claim 21, wherein the footprint contact area of each pin exceeds by at least a factor of two the pin cross-section of the pin portion.

23. The process as claimed in claim 21, wherein the spacing between the well and the adjacent footprint contact areas is at least about 0.001 inches, and the amount of the solder deposit is at least about 0.00001 cubic inches.

24. The process as claimed in claim 23, wherein the solder paste layer has a thickness such that it overlaps the bottom edge of each of the wells.

25. The process as claimed in claim 24, wherein the spacing between the well and the adjacent footprint contact areas is at least about 0.002 inches, and the amount of the solder deposit is at least about 0.000035 cubic inches.

* * * * *